(12) United States Patent
Perner

(10) Patent No.: US 7,145,797 B2
(45) Date of Patent: *Dec. 5, 2006

(54) SELECTING A MAGNETIC MEMORY CELL WRITE CURRENT

(75) Inventor: Frederick A. Perner, Santa Barbara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 26 days.

This patent is subject to a terminal disclaimer.

(21) Appl. No.: 11/003,904

(22) Filed: Dec. 3, 2004

(65) Prior Publication Data

US 2005/0117412 A1 Jun. 2, 2005

Related U.S. Application Data

(63) Continuation-in-part of application No. 10/725,803, filed on Dec. 2, 2003, now Pat. No. 6,937,504.

(51) Int. Cl.
*G11C 11/00* (2006.01)

(52) U.S. Cl. ............ 365/158; 265/201; 265/236
(58) Field of Classification Search .......... 365/158, 365/201, 236
See application file for complete search history.

(56) References Cited

U.S. PATENT DOCUMENTS

| 5,629,549 | A  | * | 5/1997 | Johnson ............ 257/421 |
| 6,606,262 | B1 |   | 8/2003 | Perner |
| 6,839,272 | B1 | * | 1/2005 | Ooishi ............ 365/171 |

* cited by examiner

*Primary Examiner*—Richard Elms
*Assistant Examiner*—Son T. Dinh

(57) ABSTRACT

The invention includes an apparatus and method for selecting a desirable magnitude of a magnetic memory cell write current. The method includes determining a minimal magnitude of write current for writing to the magnetic memory cell, determining a maximal magnitude of write current for writing to the magnetic memory cell, and calculating the selected magnitude of magnetic memory cell write current based on the minimal magnitude of write current and the maximal magnitude of write current.

20 Claims, 11 Drawing Sheets

SELECTING A MAGNETIC MEMORY CELL WRITE CURRENT

RELATED APPLICATIONS

This patent application is a continuation-in-part (CIP) of patent application Ser. No. 10/725,803, filed Dec. 2, 2003 now U.S. Pat. No. 6,937,504.

FIELD OF THE INVENTION

The invention relates generally to electronic memory. More particularly, the invention relates to an apparatus and method for selecting a magnetic memory cell write current.

BACKGROUND OF THE INVENTION

Non-volatile memory is memory that retains its content (data) even when power connected to the memory is turned off. Magnetic random access memory (MRAM) is a type of non-volatile memory. A logical state, or bit, is stored in MRAM by setting magnetic field orientations of MRAM cells within the MRAM. The magnetic field orientations remain even when power to the MRAM cells is turned off.

FIG. 1 shows an MRAM cell 100. The MRAM memory cell 100 includes a soft magnetic region 120, a dielectric region 130 and a hard magnetic region 110. The orientation of magnetization within the soft magnetic region 120 is non-fixed, and can assume two stable orientations as shown by the arrow M1. These two orientations, are either parallel or anti-parallel to the magnetic orientation of the hard magnetic region 110, and determine the logical state of the MRAM memory cell 100. The hard magnetic region 110 (also referred to as a pinned magnetic region) has a fixed magnetic orientation as depicted by the arrow M2. The dielectric region 130 generally provides electrical insulation between the soft magnetic region 120 and the hard magnetic region 110.

The MRAM memory cell is generally located proximate to a crossing point of a word line (WL) and a bit line (BL). The magnetic orientations of the MRAM memory cells are set (written to) by controlling the directions of electrical currents flowing through the word lines and the bit lines, and therefore, by the corresponding magnetic fields induced by the electrical currents. Additionally, the write lines can also be used to read the logic value stored in the memory cells.

The MRAM memory cells are read by sensing a resistance across the MRAM memory cells. The resistance is sensed through the word lines and the bit lines. Generally, the resistance (and therefore, the logical state) of a magnetic memory cell depends on the relative orientations of magnetization in the data layer and the reference layer. For example, the magnetic memory cell is in a state of low resistance if the overall orientation of the magnetization in its data storage layer is parallel to the pinned orientation of magnetization of the reference layer. Conversely, the tunneling junction memory cell is in a high resistance if the overall orientation of magnetization in its data storage layer is anti-parallel to the pinned orientation of magnetization of the reference layer. The magnitude of the switching field required to switch the state of the magnetic memory cells can change over time, further complicating processes for switching the states of the magnetic memory cells.

FIG. 2 shows an array 210 of MRAM memory cells. Bit line and word line selections are made by a row decoder 220 and a column decoder 230, which select a memory cell by conducting current through a selected bit line (BL) and a selected word line (WL). For example, a memory cell 250 is selected by conducting current though a selected bit line 260 and a selected word line 270. The induced magnetic fields should be great enough to reliably set the orientation of magnetization of the selected memory cells of the array of MRAM memory cells 210. The logical states of the memory cells are sensed through corresponding word lines and bit lines by a sense amplifier 240.

The array 210 of MRAM memory cells can suffer from half-select errors when writing to the memory cells. Writing to the memory cells includes selecting a particular bit line (BL), and selecting a particular word line (WL). A half-select error occurs when a memory cell associated with a selected bit line and a non-selected word line changes states, or when a memory cell associated with a non-selected bit line and a selected word line changes states. Clearly, half-select errors degrade the performance of MRAM memory. The write current to the memory cells should be controlled from being so large that excessive half-select errors occur.

It is desirable to minimize half-select errors of MRAM memory cells within arrays of MRAM memory cells by ensuring that the write current applied to the memory cells is not too large. Additionally, it is desirable ensure that write operations to the MRAM memory cells be consistent and reliable. That is, the write current should be great enough to provide consistent writing to the memory cells.

SUMMARY OF THE INVENTION

The invention includes an apparatus and method for selecting a magnetic memory cell write current. The apparatus and method selects a magnitude of the magnetic memory cell write current that minimizes half-select errors, while still providing consistent and reliable magnetic memory cell writing.

An embodiment of the invention includes a memory array. The memory array includes a write current generator for generating a write current that is coupled to an array of memory cells. A current regulator selects a magnitude of the write current generation by the write current generator that is based upon a minimal threshold magnitude of write current and a maximal threshold magnitude of write current.

Another embodiment of the invention includes a method of selecting a magnitude of a magnetic memory cell write current. The method includes determining a minimal magnitude of write current for writing to a magnetic memory cell, determining a maximal magnitude of write current for writing to the magnetic memory cell, and calculating the selected magnitude of magnetic memory cell write current based on the minimal magnitude of write current and the maximal magnitude of write current.

Other aspects and advantages of the present invention will become apparent from the following detailed description, taken in conjunction with the accompanying drawings, illustrating by way of example the principles of the invention.

DETAILED DESCRIPTION

The invention includes an apparatus and method of writing to magnetic memory cells. The apparatus and method minimizes half-select errors while still providing write operations to the MRAM memory cells that are consistent and reliable.

Figure 1:
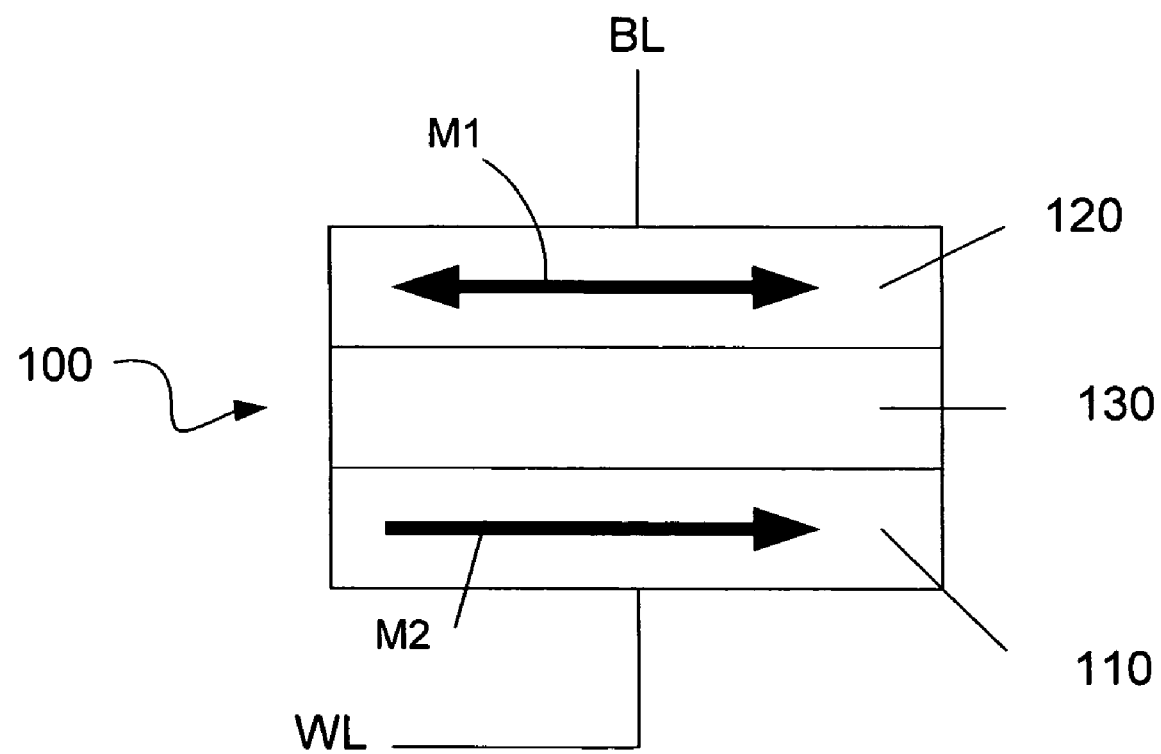
FIG. 1 shows a prior art MRAM memory cell.
Figure 2:
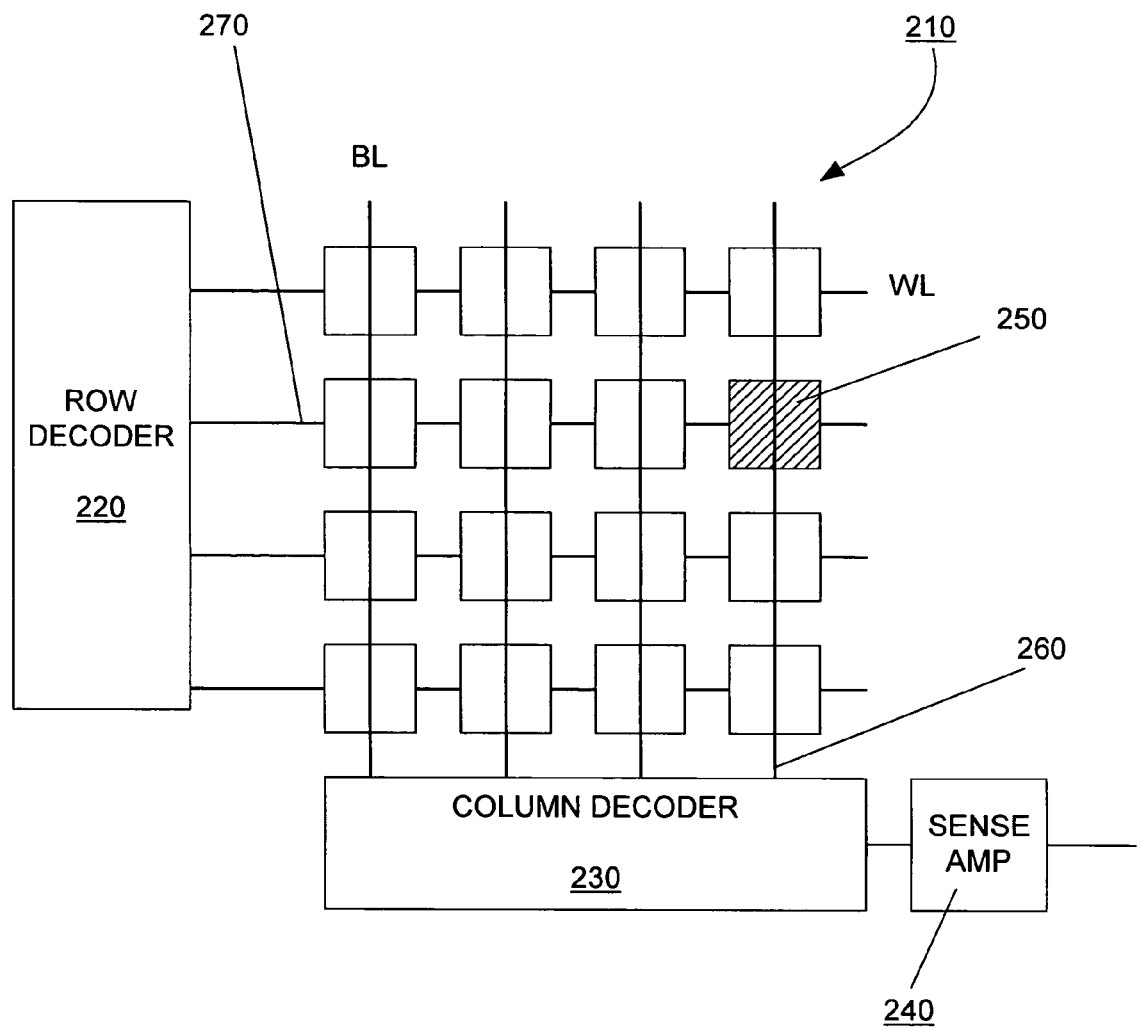
FIG. 2 shows an array of MRAM memory cells.
Figure 3:
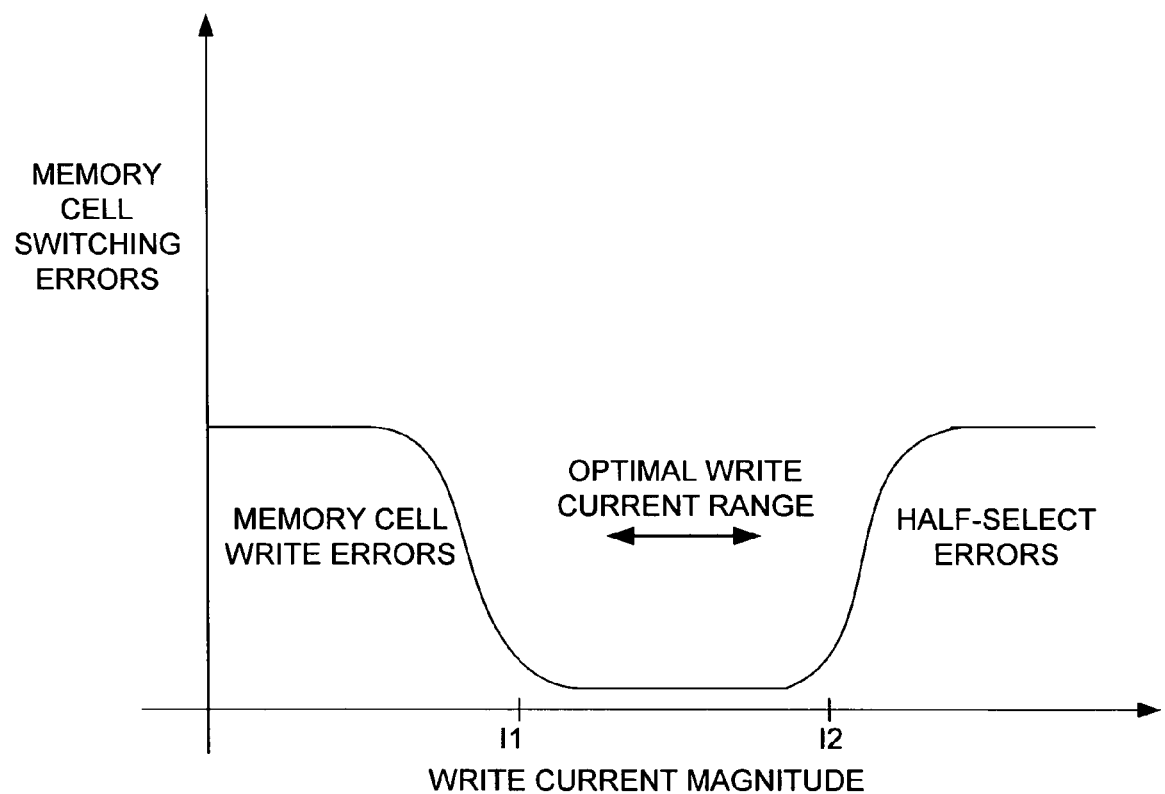
FIG. 3 is a plot showing a relationship between magnetic memory write current and possible memory write errors.

FIG. 3 is a plot showing a relationship between magnetic memory write current and possible magnetic memory write errors. FIG. 3 shows that when the write current is below a first threshold current (I1), then memory cell write errors occur. If the write current is below the first threshold (I1), the magnetic field created by the write current is too small to consistently write to the memory cells.

FIG. 3 shows that if the write current to a magnetic memory cell within an array of magnetic memory cells is greater than a second threshold current (I2), then magnetic memory cells within the array are likely to suffer from half select errors. Half-select errors occur when a memory cell associated with a selected bit line and a non-selected word line changes states, or when a memory cell associated with a non-selected bit line and a selected word line changes states. Generally, half-select errors occur when the magnitude of the write current is too large, and more memory cells than the desired memory cell are magnetically induced to change states.

As suggested by FIG. 3, there is generally an optimal range of write current for magnetic memory cells within an array of magnetic memory cells. The optimal range is great enough to reliably write to a magnetic memory cell, but low enough to minimize half-select errors within the array of magnetic memory cells.

Figure 4:
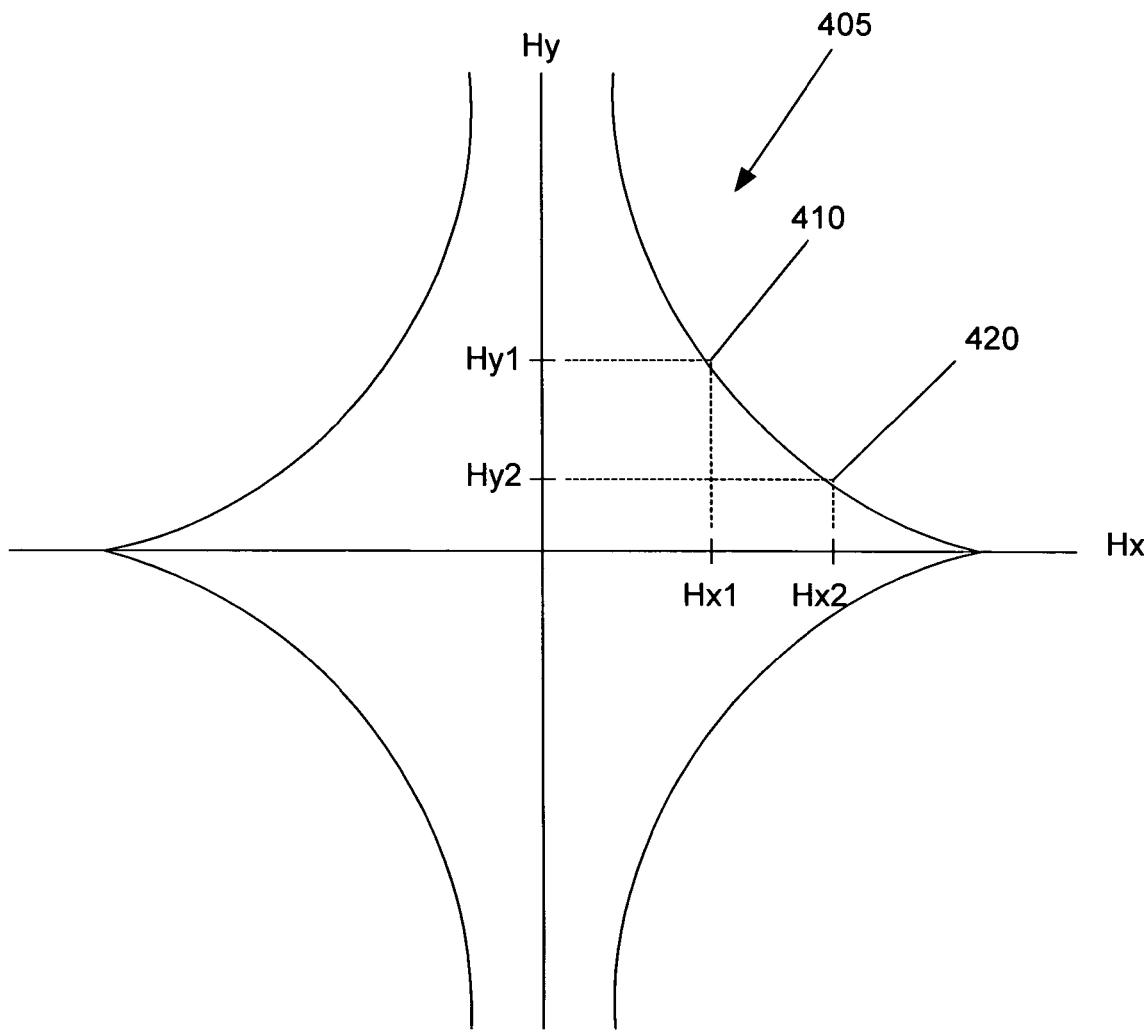
FIG. 4 is a plot showing an intensity of externally applied magnetic fields required to cause an MRAM memory cell to change states.

FIG. 4 is a plot showing an intensity of externally applied magnetic fields required to cause an MRAM memory cell to change state. A first axis of the plot is an Hx axis and a second axis of the plot is an Hy axis. Generally, an X-axis of the described magnetic tunnel junction memory cells corresponds with the longest cross-sectional dimension of the magnetic tunnel junction memory cells, and therefore, the most stable magnetic orientation of the magnetic tunnel junction memory cells. As a result, two stable magnetic orientations of the magnetic tunnel junction cells are parallel and anti-parallel to the X-axis of the memory cells.

FIG. 4 shows the magnetic field intensity required to "flip" or change the magnetic orientation of the soft magnetic region of the magnetic memory cell. For example, a first quadrant 405 of the plot of FIG. 4 shows the required Hx magnetic field to cause the MRAM memory cell to change magnetic states for various values of applied Hy magnetic field. A first switch point 410 suggests a first level $Hx_1$ of required Hx magnetic field intensity to change the magnetic state of the memory cell for a first level $Hy_1$ of Hy magnetic filed intensity. A second switch point 420 suggests a second level $Hx_2$ of required Hx magnetic field intensity to change the magnetic state of the memory cell for a second level $Hy_2$ of Hy magnetic field intensity. The required $Hx_2$ magnetic field intensity of the second switch point 420 is greater than the required $Hx_1$ magnetic field intensity of the first switch point 410.

Information regarding the Hy, Hx switching characteristics of the magnetic memory cells can be used to select Hy, Hx magnetic fields that minimize half-select errors. More specifically, increasing the Hy magnetic field of a selected memory cell decreases the Hx magnetic field required to write to the magnetic memory cell. Therefore, other non-selected magnetic memory cells within an array of magnetic memory cells include an Hy magnetic field that is negligible, and therefore, require a greater Hx magnetic field to cause a change in state. Selected memory cells should include a write current that includes an Hy magnetic field that is as great (the maximum level of Hy magnetic field is generally limited by power dissipation) as is reasonably possible to minimize half-select errors.

The Hy, Hx switching characteristics of the magnetic memory cells can also be used to minimize write errors. More specifically, for a selected Hy, an Hx magnetic field is selected to ensure proper writing to the selected memory cell. That is, an Hx magnetic field is selected that is great enough to provide reliable writing to the selected magnetic memory cell. However, the Hx magnetic field cannot be so great that half-select errors occur.

Figure 5:
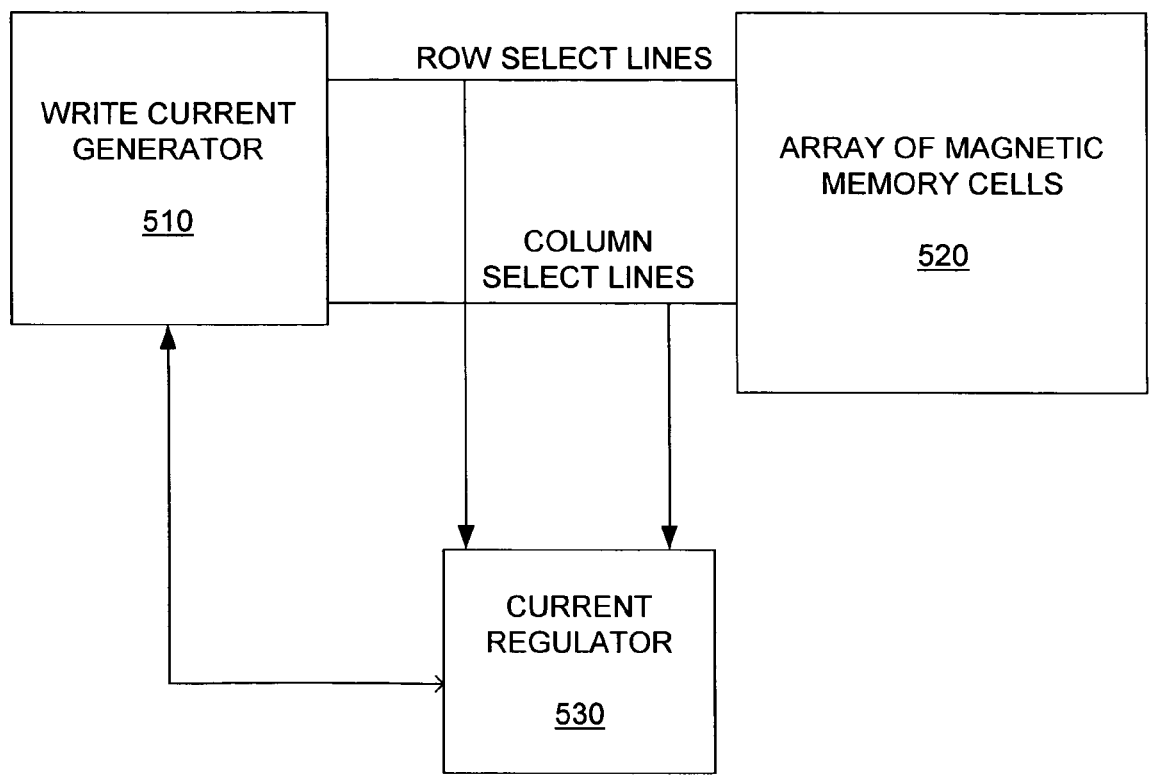
FIG. 5 shows one memory array write mechanism that implements principles of the invention.

FIG. 5 shows one exemplary apparatus for writing to memory cells. The apparatus includes a write current generator 510 for generating a write current that is coupled to the memory cells 520. A current regulator 530 selects a magnitude of the write current generated by the write current generator 510 that is based upon a minimal threshold magnitude of write current and a maximal threshold magnitude of write current.

Figure 6:
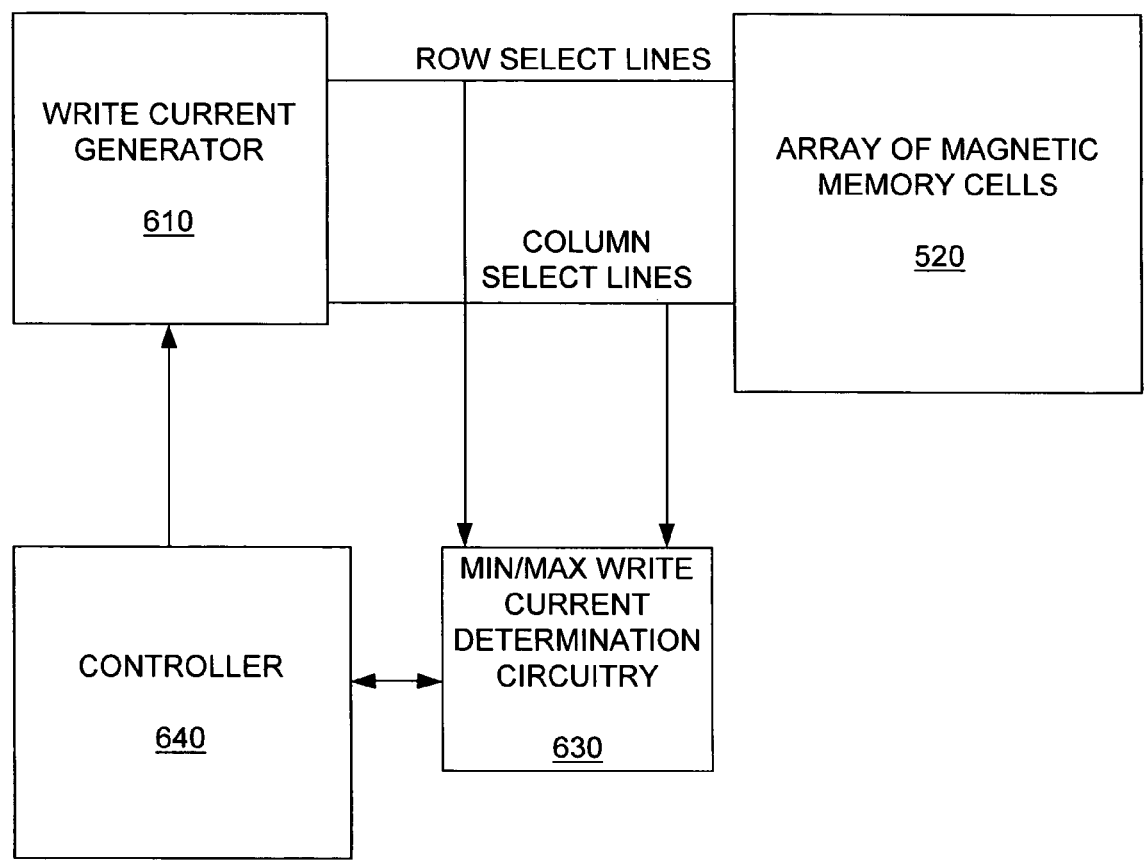
FIG. 6 shows another memory array write mechanism that implements principles of the invention.

FIG. 6 shows an embodiment similar to FIG. 5, but where one write current regulation circuit is presented in additional detail. This embodiment includes a write generator circuit 610 for calculating a selected magnitude of the write current. The write current is magnetically coupled to a selected magnetic memory cell within an array of magnetic memory cells 520.

The embodiment of FIG. 6 includes minimum and maximum write current determination circuitry 630. The write current controlled by the write current circuitry 610 is coupled to the write current determination circuitry 630. A controller 640 provides some control of a counter value within the write generator circuitry 610. The count value of the write generator circuitry 610 provides control of the magnitude of the write current.

One variation of the embodiment of the write current determination circuitry 630 includes a switching response of the at least one test magnetic memory cell being used to determine a magnitude of the write current controlled by the write generator circuitry 610. The switching response of the test magnetic memory cell determines the optimal write current range in which the write current is great enough to provide reliable writing to a selected memory cell within the array of magnetic memory cells 520, but small enough that half select errors within the array of magnetic memory cells are minimized. Other methods of determining the minimum and maximum write currents can be used. Essentially the write current determination circuitry functions as a current regulator for ensuring that the write current generated by the write current generator is greater than a minimal magnitude of write current and less than a maximal magnitude of write current.

The write generator circuitry 610 typically includes a binary (averaging) counter and a current digital to analog converter (iDAC). The averaging counter works in association with at least one test magnetic memory cell within the write current determination circuitry 630 to determine an optimal magnitude for the write current for writing to memory cells of the array of magnetic memory cells 520.

The controller 640 provides control circuitry for enabling determination of the optimal magnitude write current using the averaging counter. Essentially, the binary averaging counter varies the write current (by controlling an iDAC) while the write current determination circuitry 630 senses a magnetization state of a test magnetic memory cell. Depending upon switching characteristics of the test magnetic memory cell, minimum and maximum write currents are determined. The averaging counter averages the minimum and maximum write currents to determine a desired write current.

Figure 7:
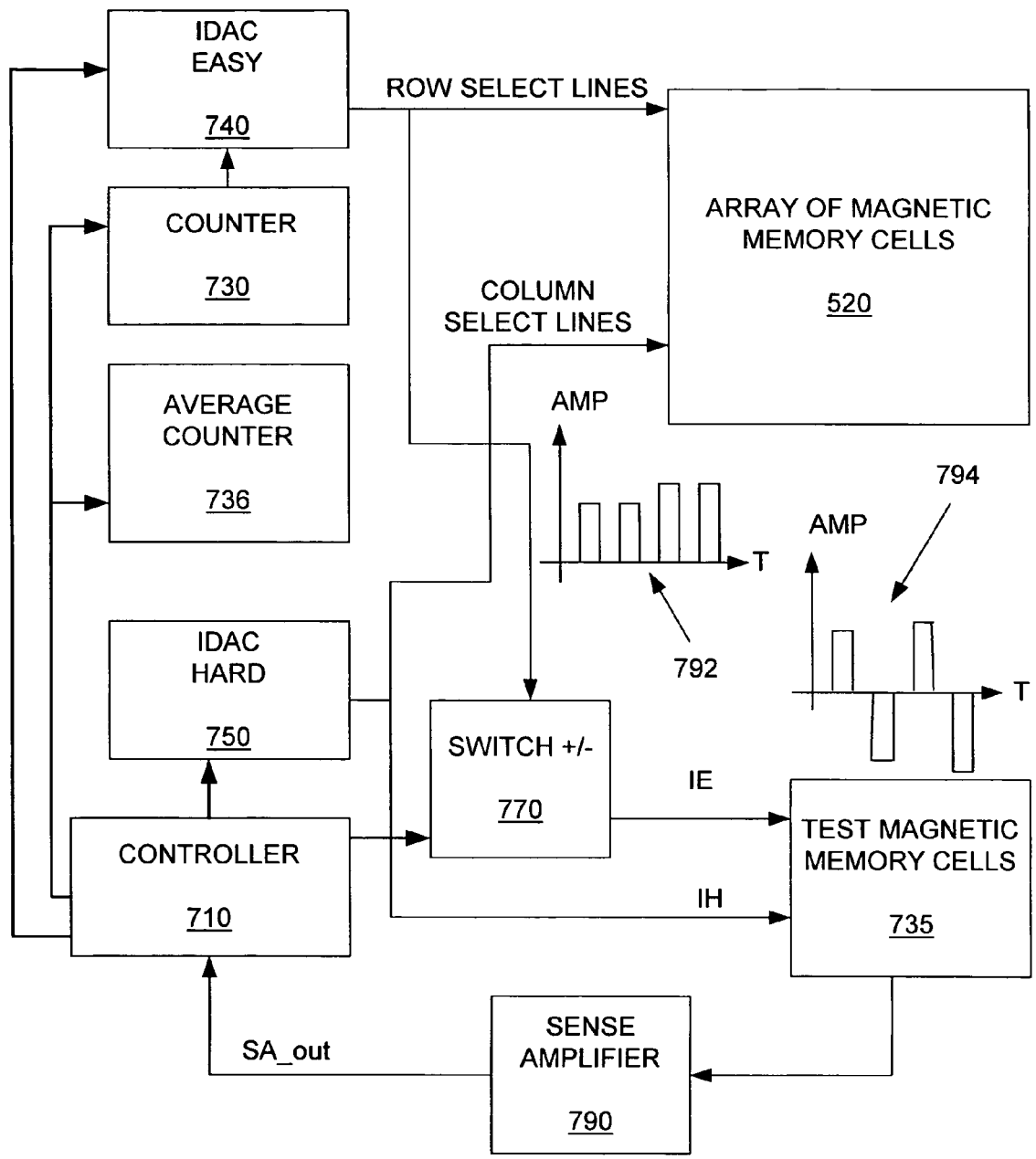
FIG. 7 shows another memory array write mechanism that implements principles of the invention.

FIG. 7 shows an embodiment similar to the embodiment of FIG. 6, but where one other write current regulation circuit is shown in greater detail. The write current generator of this embodiment includes an easy axis current digital to analog converter (IDAC) 740 and a hard axis IDAC 750. The easy axis IDAC 740 and the hard axis IDAC 750 generate a series of pulsed write signals as shown in the plot 792. The pulses are pulses of current that induce a pulsed magnetic field.

An easy axis switch 770 receives the pulsed write signals (792) of the easy axis IDAC 740, and alternates that polarity of the pulses. That is, the easy axis switch 770 generates a switch output that includes the pulsed write signal of the easy axis IDAC 740 in which the polarity (positive and negative) of the pulsed signal (shown as 794) alternates from one pulse to the next.

This embodiment does not include a hard axis switch. The uni-polarity pulsed write signals of the hard axis IDAC 750 are coupled to the test magnetic memory cells 735.

The alternating polarity pulses of the easy axis IDAC 740 and the easy axis switch 770, provide an alternating polarity pulsed magnetic field that is aligned along the easy axis of the test magnetic memory cells 735. The uni-polarity pulses of the hard axis IDAC 750 provide a uni-polarity pulsed magnetic field that is aligned along the hard axis of the test magnetic memory cells 735.

A controller 710 provides (as well as other controls) timing and amplitude control of the easy axis IDAC 740 and the hard axis IDAC 750. A sense amplifier 790 senses the logical states of the test magnetic memory cells 735. The sense amplifier 790 is connected to the controller, so the controller can determine the logical state of the test magnetic memory cells 735.

One mode of operation includes the controller setting the hard axis IDAC 750 to a default value. The default value is experimentally determined, or estimated through computer simulation. The controller then zeroes the binary counter 730, and then increments the easy axis IDAC 740 by incrementing a binary counter 730. The binary counter 730 is connected to the IDAC 740 and controls the magnitude of the write current provided by the IDAC 740. The binary counter 730 is incremented until the controller senses that a test magnetic memory cell has changed its state due to the alternating pulsed magnetic field created by the easy axis IDAC 740. An averaging counter 736 is incremented in parallel with the binary counter 730. That is, the averaging counter 736 should at this point have the same count value as the binary counter 730. This first count value represents the minimum easy axis IADC 740 current value required to reliably write to the test magnetic memory cell.

The averaging process is initiated by doubling the count value of the averaging counter 736. If the averaging counter 736 is a binary counter, the doubling process is very simple. The binary bits of the count value of the averaging counter 736 are shifted over by one. That is, each binary bit is shifted over to the next significant bit. For example, if the count value is 6 (00000110), the count value is doubled to 12 by shifting the bits over by one significant bit (that is, (00001100)).

The controller then zeroes the hard axis IADC 760. The controller then continues to increment both the binary counter 730 and the averaging counter 736. Therefore, the easy axis IADC 740 value is incremented as well, until the test magnetic memory cell changes its state due to the alternating pulsed magnetic field created by the easy axis IADC 740. This represents the maximum easy axis IADC 740 current value. Easy axis IADC 740 values of this magnitude or greater cause half-select errors in non-selected magnetic memory cells.

The averaging process is completed by halving the count value of the averaging counter 736. If the count value of the binary counter is for example 12, for the maximum easy axis current value, the averaging counter is incremented from count value of 12 to 18 (a one for one count correspondence with the binary counter incrementing from 6 to 12). The halving process is performed by shifting the binary bits over in the opposite direction as the previous doubling shift process. For example, the averaging counter value of 18 (00010010) is halved by shifting the bits of the count value over one less significant bit to realize a count value of 9 (00001001).

The averaging process is verified as correct by noting that the minimum write current corresponds to a binary counter 730 count value of 6, and that the maximum write current corresponds to a binary counter 730 count value of 12. The average count value is 9 as determined through the processes of the averaging counter 736.

The average value represents an easy axis current value that in conjunction with the default hard axis value, minimizes writing errors and half-select errors.

Figure 8:
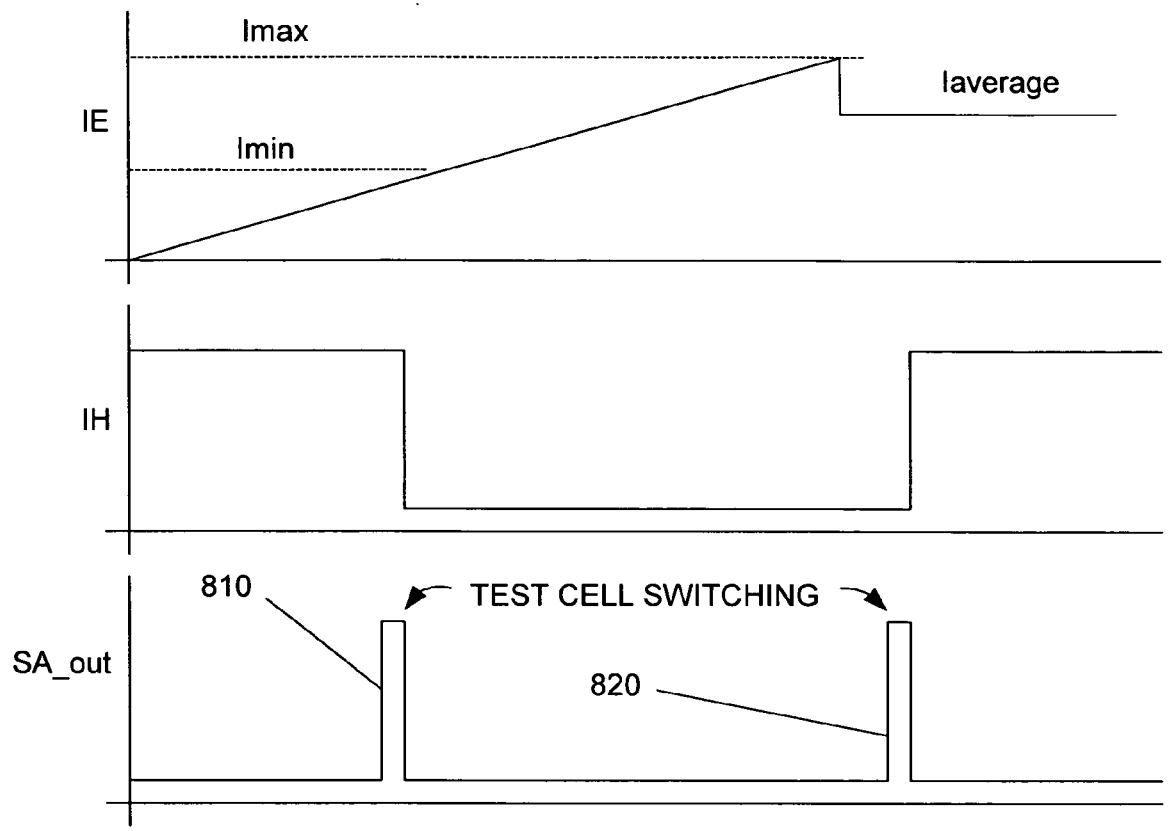
FIG. 8 shows time lines of an easy axis write current and a hard axis write current during initialization.

FIG. 8 shows time lines of an easy axis write current (IE) and a hard axis write current (IH) during initialization. The hard axis write current (IH) is initially set to a default value. The easy axis write current (IE) is ramped up from an initial value of approximately zero. As the easy axis write current (IE) is ramped up, a point is reached at which the test magnetic memory cell begins to change states. An output signal from the sense amplifier 790 SA_out indicates a change of state of the test magnetic memory cell (point 810 on FIG. 8). Once this point has been obtained, a first value of the easy axis write current (IE) is stored. The first value represents the easy axis write current (IE) required to properly write to the test magnetic memory cell. The first value is designated as Imin in FIG. 8.

The hard axis write current (IH) is then zeroed. The ramping of the easy axis write current (IE) is continued until the output signal from the sense amplifier 790 SA_out again indicates a change of state of the test magnetic memory cell (point 820 on FIG. 8). Once this point is obtained, a second value of the easy axis write current (IE) is stored. The second value represents the amount easy axis write current (IE) that causes half-select errors to occur. The second value is designated as Imax in FIG. 8.

The hard axis write current (IH) is switched back to the default value, and the easy axis write current (IE) is switched a value equivalent to an average (Iaverage) of the first and second values of the easy axis write current (IE).

Figure 9:
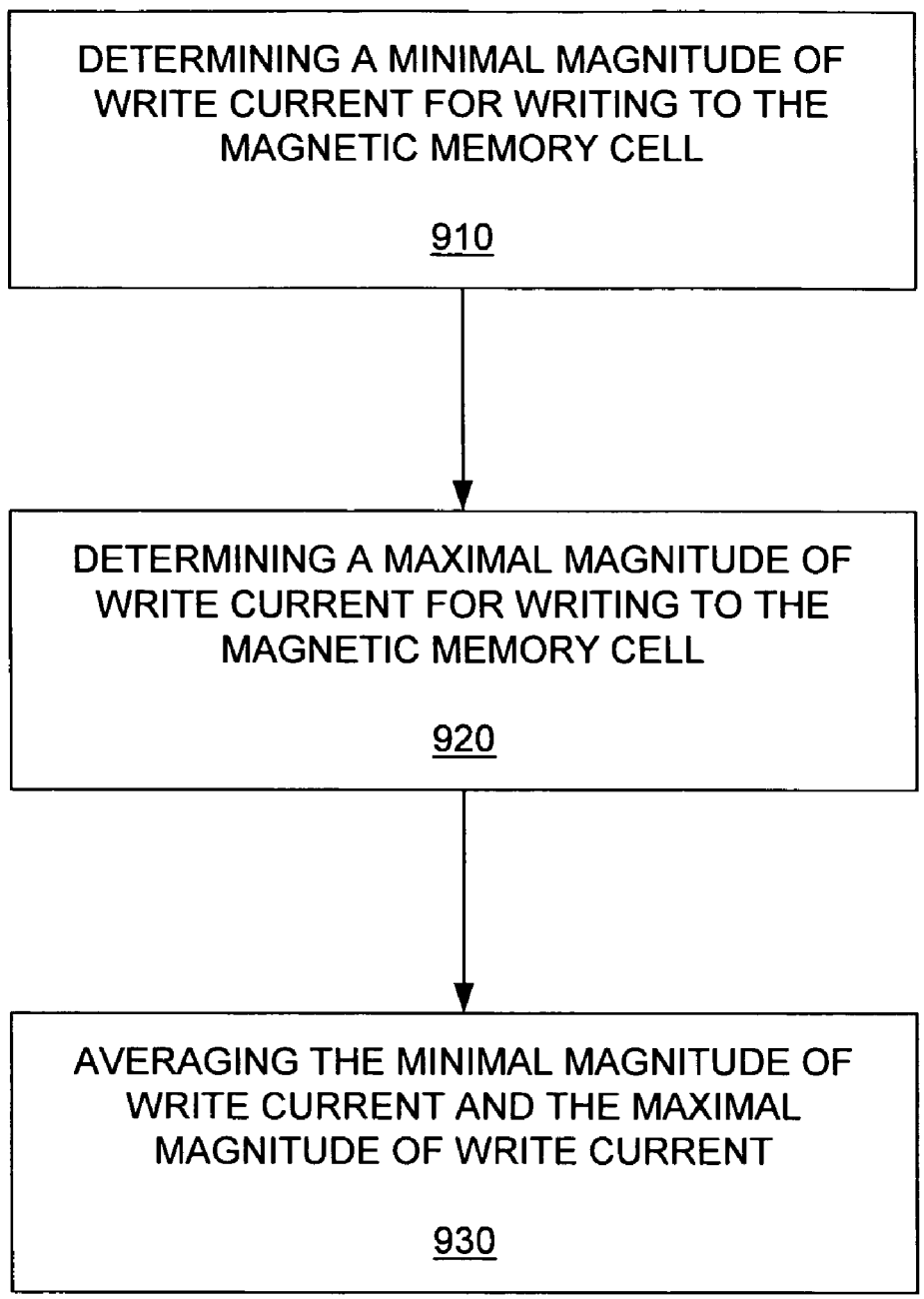
FIG. 9 shows one method of selecting a magnetic memory write current.

FIG. 9 shows an exemplary method of selecting a magnetic memory write current. A first block 910 includes determining a minimal magnitude of write current for writing to the magnetic memory cell. A second block 920 includes determining a maximal magnitude of write current for writing to the magnetic memory cell. A third block 930 includes averaging the minimal magnitude of write current and the maximal magnitude of write current. The averaging can include a weighted average. That is, the averaging can be calculated to skew the selected magnetic memory write current to be closer to either the minimal magnitude of write current or the maximal magnitude of write current.

Figure 10:
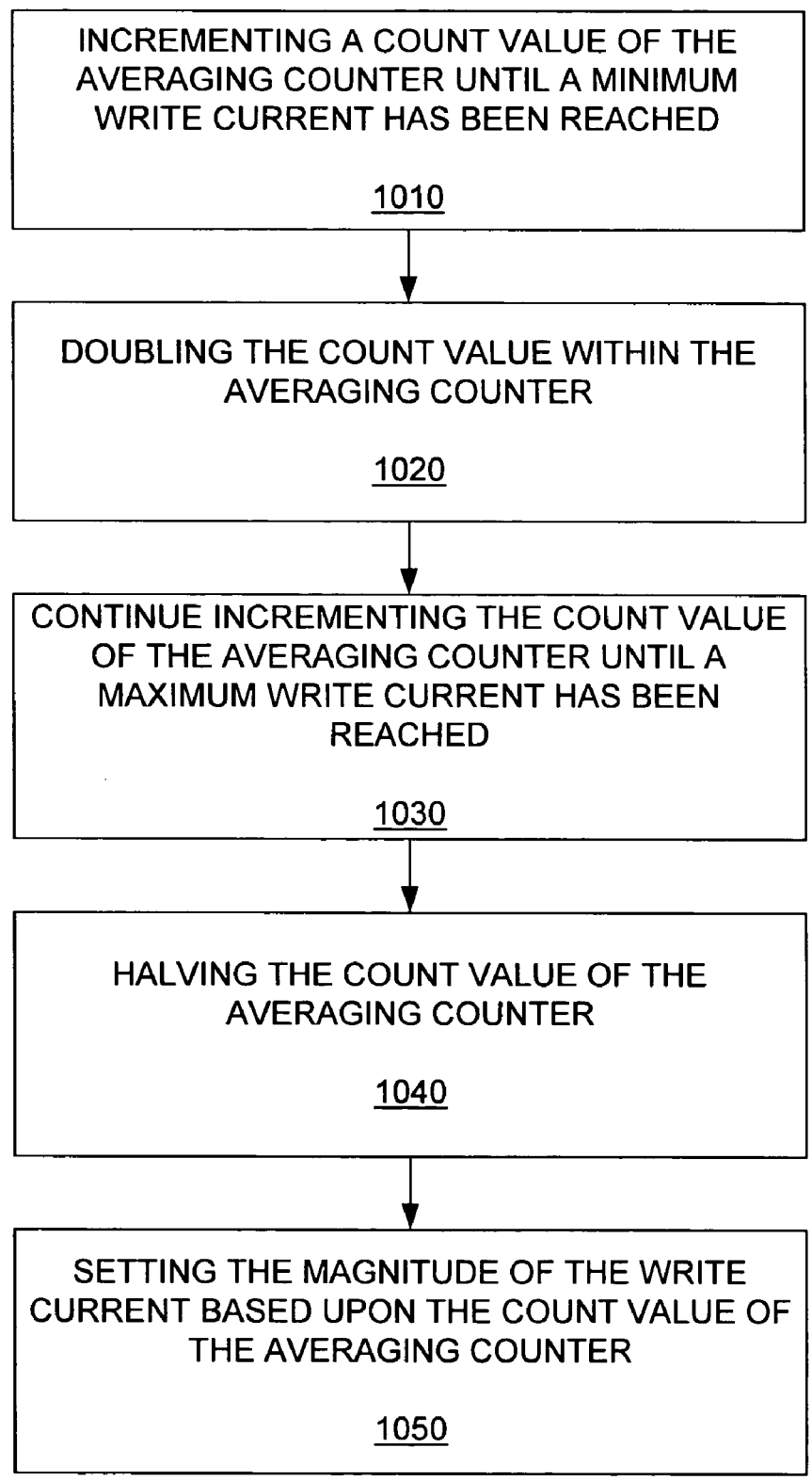
FIG. 10 shows another exemplary method of selecting a magnetic memory write current.

FIG. 10 shows another exemplary method of selecting a magnetic memory write current. An initialization process includes resetting a binary counter and an averaging counter that controls the magnetic memory write current. A first block 1010 includes incrementing a count value of an averaging counter until a minimum write current has been reached. This includes incrementing a binary counter in parallel with the averaging counter. The binary counter controls an iDAC that increments an easy axis write current of a test magnetic memory cell while the hard axis write current is set to a default value. A second block 1020 includes doubling the count value within the averaging counter. Generally, this includes doubling the count value of the averaging counter but not the binary counter that controls the easy axis write current of a test magnetic memory cell. A third block 1030 includes setting the hard axis write current to zero, and continue incrementing the count values of the averaging counter and the binary counter until a maximum write current has been reached. Again, the binary counter that controls the easy axis write current of a test magnetic memory cell is incremented in parallel with the averaging counter. A fourth block 1040 includes halving the count value of the averaging counter. This block provides an average count value between the minimum write current counter value and the maximum write current counter value. A fifth block 1060 includes setting the magnitude of the write current based upon the count value of the averaging counter. Generally, this includes loading the average count value of the averaging counter into the binary counter. A controller initiates this process. The average count value of the binary counter sets the easy axis iDAC to an average easy axis write current value. The controller sets the hard axis iDAC to the default value.

Changes in Magnetic Memory Cell Switching

Figure 11:
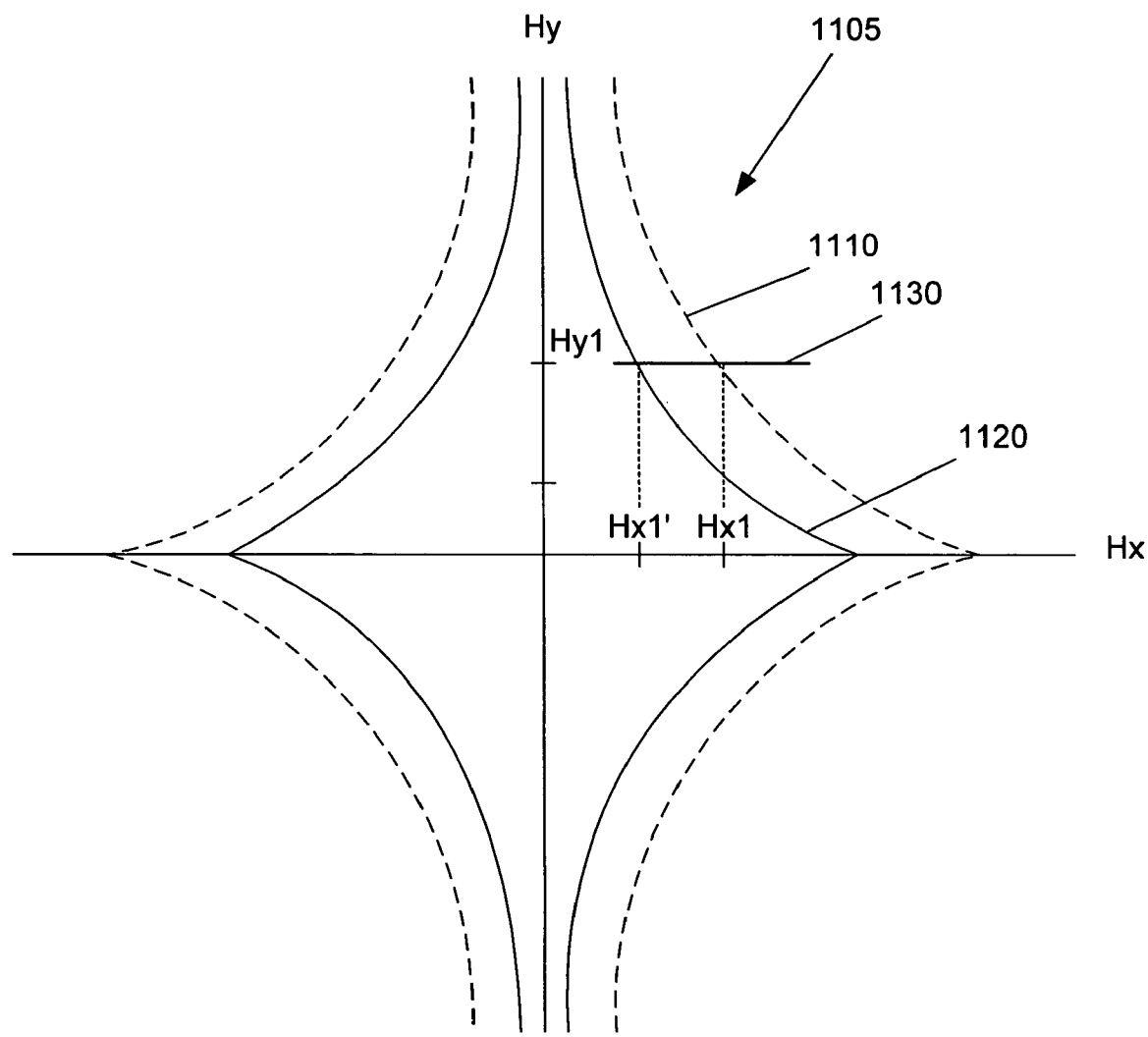
FIG. 11 is a plot showing an intensity of externally applied magnetic fields required to cause an MRAM memory cell to change states, for two different MRAM cell temperatures.

FIG. 11 is a plot showing an intensity of externally applied magnetic fields required to cause an MRAM memory cell to change states, for two different MRAM cell temperatures. A first curve 1110 represents the magnetic field intensity required to change or flip the magnetic orientation of a magnetic tunnel junction for a first temperature. A second curve 1120 represents the magnetic field intensity required to change of flip the magnetic orientation of a magnetic tunnel junction for a second temperature. Variations in the switching curves can be due to other reasons than temperature. For example, the switching curves could also change due to aging.

The effect of temperature on the ability to change to the state of the magnetic tunnel junction can be observed, by noting that the required Hx magnetic field required to change the state of the magnetic tunnel junctions for a fixed Hy magnetic field as depicted by line 1130. As depicted by line 1110, for a fixed Hy magnetic field of Hy1, the required Hx magnetic field intensity is Hx1 for the first temperature, and the required Hx magnetic field intensity is Hx1' for the second temperature. Hx1' is less than Hx1 when the second temperature is greater than the first temperature. Variations in the switching curves of the magnetic memory cells can require that the selected write current be updated or modified over time or temperature.

Although specific embodiments of the invention have been described and illustrated, the invention is not to be limited to the specific forms or arrangements of parts so described and illustrated. The invention is limited only by the appended claims.

What is claimed is:

1. An apparatus for writing to memory cells comprising:
a current digital to analog converter for generating a write current that is coupled to the memory cells; and
a current regulator for selecting a magnitude of the write current generated by the current digital to analog converter that is based upon a minimal threshold magnitude of write current and a maximal threshold magnitude of write current.

2. The apparatus of claim 1, wherein the minimum threshold magnitude of write current is a magnitude of write current required to cause at least one test magnetic memory cell to switch.

3. The apparatus of claim 1, wherein the maximum threshold magnitude of write current is a magnitude of current required to cause half-select errors within at least one test magnetic memory cell.

4. The apparatus of claim 1, wherein the current regulator averages the minimal threshold magnitude of write current and the maximal threshold magnitude of write current.

5. The apparatus of claim 1, wherein the current regulator comprises an averaging counter.

6. A method of selecting a magnitude of a magnetic memory cell digital to analog converter write current, comprising:
determining a minimal magnitude of write current for writing to a magnetic memory cell;
determining a maximal magnitude of write current for writing to the magnetic memory cell;
calculating the selected magnitude of magnetic memory cell digital to analog converter write current based on the minimal magnitude of write current and the maximal magnitude of write current.

7. The method of selecting a magnitude of a magnetic memory digital to analog converter cell write current of claim 6, wherein calculating the selected magnitude of magnetic memory cell digital to analog converter write current based on the minimal magnitude of write current and the maximal magnitude of write current comprises averaging the minimal magnitude of write current and the maximal magnitude of write current.

8. The method of selecting a magnitude of a magnetic memory digital to analog converter cell write current of claim 6, wherein the minimum magnitude of write current is a magnitude of write current required to cause at least one test magnetic memory cell to switch.

9. The method of selecting a magnitude of a magnetic memory digital to analog converter cell write current of claim 6, wherein the maximum magnitude of write current is a magnitude of current required to cause half-select errors within at least one test magnetic memory cell.

10. The method of selecting a magnitude of a magnetic memory digital to analog converter cell write current of claim 6, wherein averaging the minimal magnitude of write current and the maximal magnitude of write current is performed by an averaging counter.

11. The method of selecting a magnitude of a magnetic memory digital to analog converter cell write current of claim 10, wherein a count value of the averaging counter determines the selected magnitude of the magnetic memory digital to analog converter cell write current.

12. A method for determining a magnitude of a digital to analog converter write current for a magnetic memory cell using an averaging counter comprising:
   incrementing a count value of the averaging counter until a minimum write current has been reached;
   doubling the count value within the averaging counter;
   continue incrementing the count value of the averaging counter until a maximum write current has been reached;
   halving the count value of the averaging counter;
   setting the magnitude of the digital to analog converter write current based upon the count value of the averaging counter.

13. The method for determining a magnitude of a digital to analog converter write current of claim 12, wherein incrementing a count value of an averaging counter until a minimum write current has been reached comprises:
   selecting a default hard axis write current;
   incrementing the averaging counter, thereby incrementing an easy axis write current until a magnetic orientation of a test memory cell changes states.

14. The method for determining a magnitude of a digital to analog converter write current of claim 12, wherein doubling the count value within the averaging counter comprises:
   shifting bits one position to double the counter value, wherein the averaging counter includes a binary counter.

15. The method for determining a magnitude of a digital to analog converter write current of claim 12, wherein continue incrementing the count value of the averaging counter until a maximum write current has been reached comprises:
   zeroing the hard axis write current;
   continue incrementing the binary counter until the test memory cell changes states.

16. The method for determining a magnitude of a digital to analog converter write current of claim 12, wherein halving the count value of the averaging counter comprises:
   shifting bits one position to halve the counter value, wherein the averaging counter includes a binary counter.

17. The method for determining a magnitude of a digital to analog converter write current of claim 12, wherein setting the magnitude of the digital to analog converter write current based upon the count value of the averaging counter comprises:
   loading the count value of the averaging counter into a binary counter that drives a current digital to analog converter (iDAC).

18. The method for determining a magnitude of a digital to analog converter write current of claim 12, wherein the minimum current is a magnitude of write current required to cause at least one test magnetic memory cell to switch.

19. The method for determining a magnitude of a digital to analog converter write current of claim 12, wherein the maximum current is a magnitude of current required to cause half-select errors within at least one test magnetic memory cell.

20. The method for determining a magnitude of a digital to analog converter write current of claim 12, wherein the write current that is magnetically coupled to at least one test magnetic memory cell includes a continuous series of pulses, in which the pulses alternate in polarity.

* * * * *